(12) United States Patent
Shutoku et al.

(10) Patent No.: US 7,471,128 B2
(45) Date of Patent: Dec. 30, 2008

(54) DELAY SIGNAL GENERATOR AND RECORDING PULSE GENERATOR

(75) Inventors: Toshiyuki Shutoku, Tsushima (JP); Shin-ichiro Tomisawa, Mizuho (JP)

(73) Assignee: Sanyo Electric Co., Ltd., Osaka (JP)

( * ) Notice: Subject to any disclaimer, the term of this patent is extended or adjusted under 35 U.S.C. 154(b) by 627 days.

(21) Appl. No.: 10/504,607

(22) PCT Filed: Nov. 7, 2003

(86) PCT No.: PCT/JP03/14206

§ 371 (c)(1),
(2), (4) Date: Aug. 13, 2004

(87) PCT Pub. No.: WO2004/042721

PCT Pub. Date: May 21, 2004

(65) Prior Publication Data

US 2005/0174911 A1  Aug. 11, 2005

(30) Foreign Application Priority Data

Nov. 7, 2002  (JP) ............................. 2002-323785

(51) Int. Cl.
*H03L 7/06* (2006.01)
(52) U.S. Cl. .................... 327/158; 327/161; 327/163
(58) Field of Classification Search ......... 327/156–159, 327/147–150, 152, 153, 161–163
See application file for complete search history.

(56) References Cited

U.S. PATENT DOCUMENTS 6,160,456 A * 12/2000 Chang ......................... 331/25

6,570,456 B2 * 5/2003 Mano et al. .................. 331/11

(Continued)

FOREIGN PATENT DOCUMENTS

JP        6-326574        11/1994

(Continued)

OTHER PUBLICATIONS

Japanese Laid-Open Publication 2002-197657 corresponds to document AA.

(Continued)

*Primary Examiner*—Lincoln Donovan
*Assistant Examiner*—William Hernandez
(74) *Attorney, Agent, or Firm*—Occhiuti Rohlicek & Tsao LLP (57) ABSTRACT

A write strategy circuit (recording pulse generator) generates a recording pulse for controlling a laser output applied to an optical disc using data modulated by a DVD encoder or a CD encoder. A delay circuit delays delay subject signals by a predetermined amount to generate delay signals. A delay amount for the delay circuit is controlled by a delay amount control circuit. A logic circuit generates a recording pulse by logically synthesizing the delay signals. The delay amount control circuit includes a voltage controlled oscillator formed by connecting, in a ring-like manner, a plurality of delay elements having the same configuration as the delay elements included in the delay circuit. An output signal of the voltage controlled oscillator is locked at a point where a delay amount for each delay element becomes a fraction of an integer of one cycle of a reference clock signal.

7 Claims, 4 Drawing Sheets

U.S. PATENT DOCUMENTS

| | | | |
|---|---|---|---|
| 7,177,252 B2 * | 2/2007 | Watanabe et al. | 369/47.51 |
| 2001/0055357 A1 * | 12/2001 | Chen | 375/376 |
| 2002/0105873 A1 * | 8/2002 | Watanabe et al. | 369/47.51 |
| 2002/0175722 A1 * | 11/2002 | Mano et al. | 327/156 |

FOREIGN PATENT DOCUMENTS

| | | |
|---|---|---|
| JP | 07-201136 | 8/1995 |
| JP | 07-202643 | 8/1995 |
| JP | 07-264023 | 10/1995 |

OTHER PUBLICATIONS

Japanese Laid-Open Publication 2002-109657 corresponds to document AA.

* cited by examiner

DELAY SIGNAL GENERATOR AND RECORDING PULSE GENERATOR

FIELD OF THE INVENTION

The present invention relates to a delay signal generator that is capable of generating, for a single input signal, a plurality of differing delay signals having different minimum units of delay amounts, and to a recording pulse generator that is capable of retrieving modulated data, which has been subjected to predetermined modulation, and generating recording pulses for at least two different disc media.

BACKGROUND ART

A data recorder, which records desired data using a laser on a disc medium functioning as a recording medium, such as an optical disc, usually includes a write strategy circuit. The write strategy circuit generates a timing signal for controlling the state of laser irradiation. One example of such a timing signal is a recording pulse, which is generated by pulse-modulating data subject to recording, for controlling the intensity and time of laser irradiation on a disc medium. The laser irradiation is carried out according to the recording pulse so that pits corresponding to the desired data in an optimal manner are formed on the disc medium.

A timing signal, such as a recording pulse, is generated, its unit being a time interval that is shorter than the cycle of a reference clock signal. The reference clock signal is a clock signal corresponding to the rotation mode of the disc medium and serves as a reference for the recording operation. The write strategy circuit generates a plurality of delay signals, each having a predetermined delay with respect to an edge of the reference clock signal. By using such delay signals, the write strategy circuit generates a timing signal, its unit being a time interval shorter than the cycle of the reference clock signal, for controlling the mode of laser irradiation.

In recent years, various disc media, such as CD-R (Compact Disc-Recordable), CD-RW (Compact Disk-Rewritable), DVD-R (Digital Versatile Disc-Recordable), and DVD-RW (Digital Versatile Disc-Rewritable), have appeared on the market. Under such circumstances, there has been a demand for versatile recording controllers and reproduction controllers for controlling recording and reproduction of data on plural types of disc media, such as a CD-R and a DVD-R. However, such recording controllers and reproduction controllers cannot be constructed without a substantial increase in their circuit scale.

The specification relating to control of the laser irradiation state differs for each type of disc medium. This enlarges the circuit scale of the write strategy circuit. To be more specific, the write strategy circuit generates a timing signal whose time interval differs depending on the specification for each disc medium. To this end, the write strategy circuit is required to include a separate delay circuit for each specification in order to generate a delay signal corresponding to each specification. This inevitably enlarges the circuit scale of the write strategy circuit.

The above-described problem is not limited to the write strategy circuit, but commonly occurs with any delay signal generator that generates, from a single input signal, a plurality of delay signals differing from one another in the minimum unit of delay amount.

SUMMARY OF THE INVENTION

Accordingly, it is an object of the present invention to provide a delay signal generator and a recording pulse generator that optimally suppress an increase in their circuit scales even when generating, for a single input signal, a plurality of delay signals differing from one another in the minimum unit of delay amounts.

To achieve the above object, a first aspect of the present invention is a delay signal generator provided with a delay circuit for delaying an input signal in a stepped manner and including a plurality of series-connected first delay elements, each controlling a delay amount in accordance with a control voltage. A delay amount control circuit, connected to the delay circuit, generates the control voltage and supplies the plurality of first delay elements with the control voltage. A selector, connected to the delay circuit, selects an output of one of the plurality of first delay elements and generates a delay signal with a predetermined delay amount. The delay amount control circuit includes a voltage controlled oscillator having a plurality of second delay elements connected in a ring-like manner. The second delay elements each have the same configuration as the first delay elements, and the quantity of the second delay elements is based on the quantity of the first delay elements. A first frequency divider, connected to the voltage controlled oscillator, divides the frequency of an output signal of the voltage controlled oscillator by a first frequency dividing ratio to generate a first frequency-divided signal. A second frequency divider divides the frequency of a predetermined reference clock signal by a second frequency dividing ratio to generate a second frequency-divided signal. A phase comparator, connected to the first and second frequency dividers, compares a phase of the first frequency-divided signal and a phase of the second frequency-divided signal to generate a comparison signal. A filter circuit, connected to the phase comparator, generates the control voltage in response to the comparison signal. The delay amount control circuit changes the delay amount for one of the first delay elements included in the delay circuit by changing a frequency dividing ratio rate that is a ratio of the second frequency dividing ratio relative to the first frequency dividing ratio.

A second aspect of the present invention is a recording pulse generator for retrieving modulated data that has been subjected to a predetermined modulation process and generating recording pulses for at least two disc media that differ from each other. The recording pulse generator is provided with a plurality of delay circuits, each of which delays an input signal in a stepped manner, includes a plurality of series-connected first delay elements, and controls a delay amount in accordance with a control voltage. A delay amount control circuit, connected to the plurality of delay circuits, generates the control voltage and supplying the plurality of first delay elements included in each delay circuit with the control voltage. A plurality of selectors are each connected in correspondence with one of the plurality of delay circuits. Each of the selectors selects an output of one of the plurality of first delay elements included in the corresponding delay circuit and generates a delay signal with a predetermined delay amount. A logic circuit, connected to the plurality of selectors, logically synthesizes the delay signal of each selector to generate a recording pulse. The delay amount control circuit changes a delay amount for one of the first delay elements included in each delay circuit by changing the control voltage.

The delay amount control circuit is provided with a voltage controlled oscillator including a plurality of second delay elements, each having the same configuration as the first delay elements and being connected in a ring-like manner. The quantity of the second delay elements is based on the quantity of the first delay elements. A first frequency divider, connected to the voltage controlled oscillator, divides the frequency of an output signal of the voltage controlled oscillator by a first frequency dividing ratio and generates a first frequency-divided signal. A second frequency divider divides the frequency of a predetermined reference clock signal by a second frequency dividing ratio and generates a second frequency-divided signal. A phase comparator, connected to the first and second frequency dividers, compares a phase of the first frequency-divided signal and a phase of the second frequency-divided signal to generate a comparison signal. A filter circuit, connected to the phase comparator, generates the control voltage in response to the comparison signal. The delay amount control circuit changes the delay amount for one of the first delay elements included in each delay circuit by changing a frequency dividing ratio rate that is a ratio of the second frequency dividing ratio relative to the first frequency dividing ratio.

DETAILED DESCRIPTION OF THE PREFERRED EMBODIMENTS

A recording pulse generator according to a preferred embodiment of the present invention applied to a write strategy circuit for CDs and DVDs will now be described with reference to the drawings.

Figure 1:
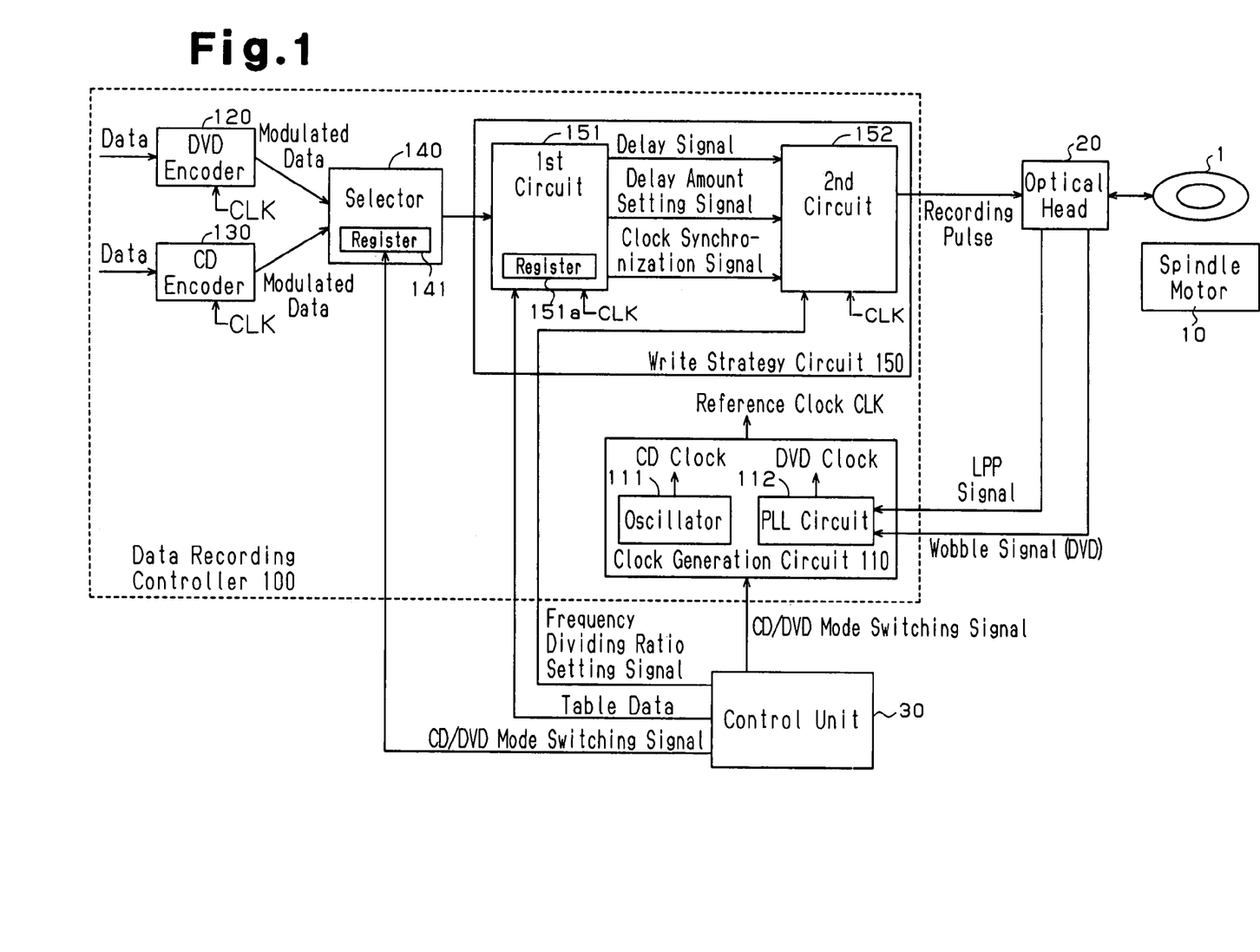
FIG. 1 is a schematic block diagram showing the entire configuration of a write strategy circuit according to a preferred embodiment of the present invention.

FIG. 1 is a block diagram showing the configuration of a data recording controller, including the write strategy circuit, and its peripheral circuits.

In FIG. 1, an optical disc 1, which is controlled to be rotated with a constant linear velocity by a spindle motor 10, is a CD (CD-R or CD-RW) or a DVD (DVD-R or DVD-RW). On the optical disc 1, regardless of whether it is a CD or a DVD, a single spiral track is formed as a data recording area. The track is formed by creating a groove in a flat surface (land) of the disc.

When the optical disc 1 is a CD, the groove is slightly wobbled. Information called ATIP (Absolute Time In Pregroove) is recorded where a cycle change occurs in the wobble of the groove. By tracing the track to read the ATIP information written in the wobble of the groove, absolute time information of the present track position can be obtained.

When the optical disc 1 is a DVD, a groove is also slightly wobbled. However, the wobble of the groove does not necessarily include address information. A DVD has, in addition to wobbles, areas called "land prepits (LPP)", which include positional information on the disc medium, at predetermined intervals on the track.

The data recording controller 100 retrieves data stored in a DRAM (not shown), generates a recording pulse corresponding to the retrieved data, and outputs the recording pulse to an optical head 20. A control unit 30 is included in a data recorder on which the data recording controller 100 is mounted and is a microcomputer for controlling each unit of the data recorder. According to the type of the optical disc 1, the control unit 30 outputs specification information relating to data recording control to the data recording controller 100.

The data recording controller 100 will now be described in more detail.

A clock generation circuit 110 generates different reference clock signals CLK depending on whether the optical disc 1 is a CD or a DVD. The reference clock signal CLK is an operation clock signal for the data recording controller 100. To generate such a different reference clock signal CLK, the clock generation circuit 110 includes an oscillator 111 and a PLL circuit 112.

The oscillator 111 is a circuit for generating an operation clock signal used by the data recording controller 100 to control recording of data onto a CD, which serves as the optical disc 1. The oscillator 111 is formed by, for example, a crystal oscillator.

The PLL circuit 112 is a circuit for generating an operation clock signal used by the data recording controller 100 to control recording of data onto a DVD, which serves as the optical disc 1. The PLL circuit 112 generates a clock signal CLK based on an LPP signal and a wobble signal output from the optical head 20. To be more specific, when retrieving a wobble signal and generating a clock signal with a predetermined frequency, the PLL circuit 112 further retrieves an LPP signal and finely adjusts the frequency to generate a clock signal CLK. The PLL circuit 112 may be one that is described in, for example, Japanese Patent Application Nos. 2000-028159, 2000-038193, and 2000-049702. Further, the PLL circuit 112 may generate a clock signal CLK based on either a wobble signal or an LPP signal.

A command signal (CD/DVD mode switching signal) issued by the control unit 30 determines which one of a clock signal output from the oscillator 111 and a clock signal output from the PLL circuit 112 is used as the reference clock signal CLK to be output from the clock generation circuit 110.

A DVD encoder 120 performs 8 to 16 bits modulation in compliance with the DVD data format on data input from the DRAM (not shown). The DVD encoder 120 operates in accordance with the reference clock signal CLK generated by the clock generation circuit 110.

A CD encoder 130 performs 8 to 14 bits modulation in compliance with the CD data format on data input from the DRAM (not shown). The CD encoder 130 also operates in accordance with a reference clock signal CLK generated by the clock generation circuit 110.

The data modulated by the DVD encoder 120 and the data modulated by the CD encoder 130 are both input into a selector 140. The selector 140 selectively outputs the data modulated by the DVD encoder 120 or the data modulated by the CD encoder 130. In more detail, the selector 140 includes a register 141 for storing information that designates the data that is to be output from the modulated data. When information indicating whether the optical disc 1 is a CD or a DVD, or information designating the desired data, is written to the register 141 by the control unit 30, the selector 140 selects an output signal according to the written information.

The modulated data to be selectively output from the selector 140 is retrieved in a write strategy circuit 150 as data that is pulse-modulated to a recording pulse for controlling the output of laser that irradiates the optical disc 1. The write strategy circuit 150 generates a recording pulse based on the modulated data and outputs the recording pulse to the optical head 20.

In more detail, the write strategy circuit 150 includes a first circuit 151, which generates various signals used to generate a recording pulse based on the modulated data and the reference clock signal CLK, and a second circuit 152, which generates a recording pulse based on the various signals.

The first circuit 151 generates the following three signals:

a delay subject signal, which is a signal subject to delay in the second circuit 152;

a delay amount setting signal, which is a signal for setting a delay amount by which the delay subject signal is delayed in the second circuit 152; and a clock synchronization signal, which is a signal used, together with a delay signal generated in the second circuit 152 based on the delay subject signal, to generate a recording pulse. The clock synchronization signal is a pulse signal that rises or falls in synchronization with the rising edges of the reference clock signal CLK.

The generation mode for the delay subject signal, the delay amount setting signal, and the clock synchronization signal in the first circuit 151 changes according to the specification relating to data recording on the optical disc 1, that is, according to the specification of the recording pulse. To be more specific, the generation mode of the signals is changed according to whether the optical disc 1 is a CD or a DVD.

In more detail, the first circuit 151 includes a register 151a for storing table data defining the pulse modulation mode of modulated data, that is, table data defining the pulse modulation mode of data that is to be pulse-modulated. The pulse modulation mode, that is, the generation mode of the delay subject signal, the delay amount setting signal, and the clock synchronization signal, is changed based on the table data.

The table data is written into the register 151a by the control unit 30.

The second circuit 152 generates the delay signal by adding a delay amount designated by a delay amount setting signal to the delay subject signal, and generates the recording pulse based on the delay signal and the clock synchronization signal.

A delay signal generation circuit 200, which is included in the second circuit 152, for generating the delay signal by adding the delay amount designated by the delay amount setting signal to the delay subject signal, will now be described with reference to FIG. 2.

Figure 2:
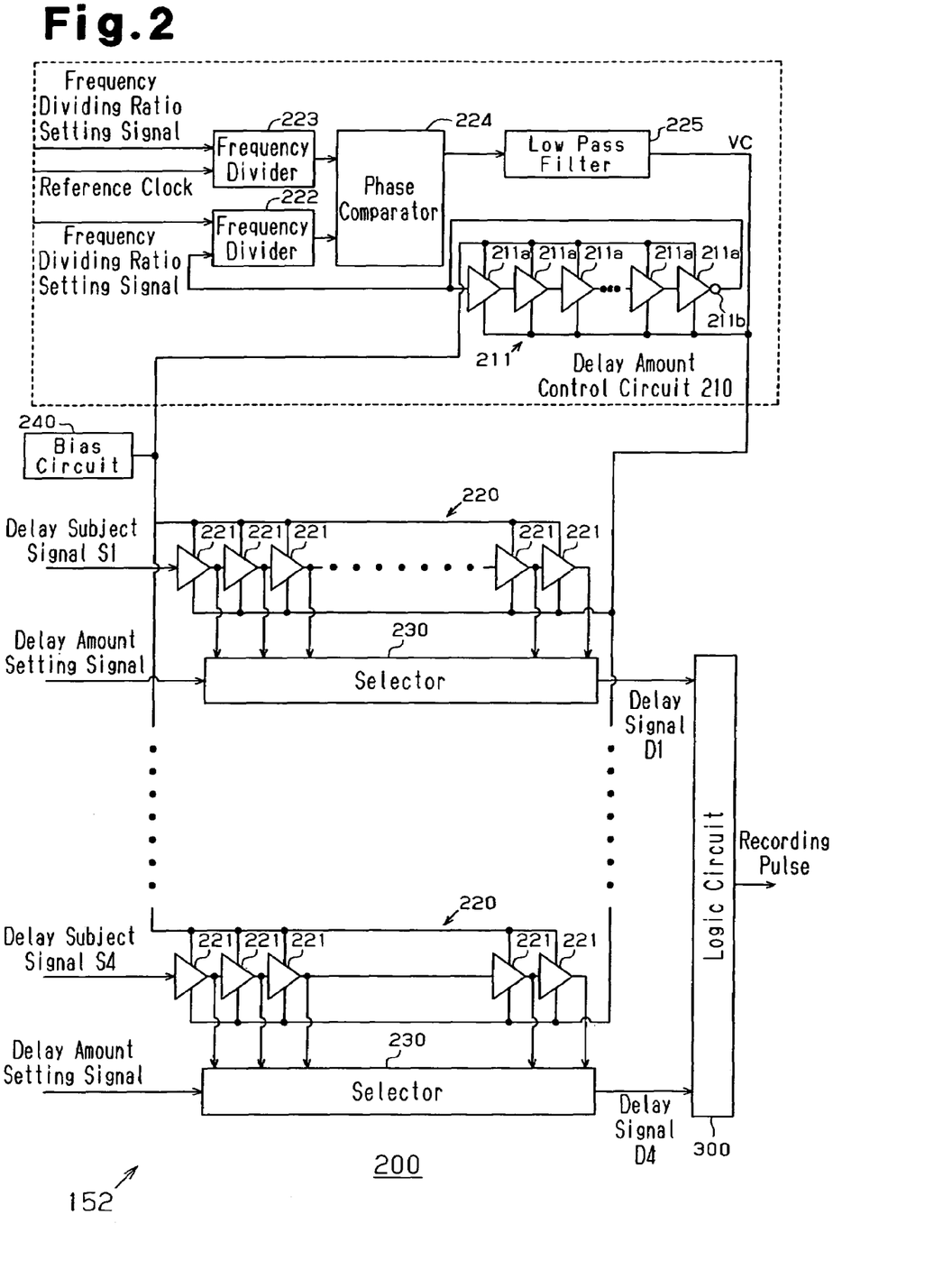
FIG. 2 is a schematic block diagram showing the configuration of a delay signal generation circuit included in the write strategy circuit of the preferred embodiment.

FIG. 2 shows the delay signal generation circuit 200 and a logic circuit 300 for generating a recording pulse by logically synthesizing delay signals and the clock synchronization signal. The delay signal generation circuit 200 and the logic circuit 300 are both included in the second circuit 152.

As shown in FIG. 2, the delay signal generation circuit 200 generates four delay signals (delay signals D1 to D4) by adding the delay amount designated by the delay amount setting signal to four different delay subject signals (delay subject signals S1 to S4).

In more detail, the delay signal generation circuit 200 includes delay circuit 220 having plural stages of delay elements 221 (a plurality of delay elements 221), selectors 230 for selectively retrieving an output signal of one of the plural stages of delay elements 221, and a delay amount control circuit 210 for executing switching control of the delay amount for each delay element 221.

The delay circuits 220 are formed by connecting, in series, the plural stages of delay elements 221, for which the delay amount is variably set according to a control voltage Vc applied thereto. There are four delay circuits 220, each corresponding to one of the delay subject signals. A different delay subject signal is input at an input terminal of each of the four delay circuits 220, which are parallel circuits. A signal delayed a predetermined amount by each stage of the delay elements 221 in each delay circuit 220 is output to the selector 230.

The selector 230 retrieves a delay amount setting signal output from the first circuit 151 shown in FIG. 1. The selector 230 selects an output signal from one of the plural stages of delay elements 221 in the delay circuit 220 according to the delay amount setting signal and outputs the selected output signal as a delay signal.

The delay amount control circuit 210 controls the control voltage that is to be applied to each stage of the delay elements 221 included in the delay circuits 220 in a manner that a delay amount for each delay element 221 becomes a fraction of an integer of one cycle of the reference clock signal CLK. Further, the delay amount control circuit 210 switches the predetermined integer according to the specification relating to generation of the recording pulse.

The specification for CDs requires an accuracy of one sixteenth of a cycle of a reference clock signal for a recording pulse. In comparison, the specification for DVDs requires an accuracy of one twentieth of a cycle of a reference clock signal for a recording pulse. In this way, the specifications for CDs and DVDs both require a recording pulse to have a pulse waveform set at a time interval shorter than a cycle of the reference clock signal. In the delay circuit 220, therefore, a minimum delay amount, which is a value obtained by dividing the time period for one cycle of a reference clock signal by an integer, is used as a unit time, and signals having delay amounts varying from the delay amount corresponding to the unit time to the delay amount corresponding to the difference between the time period of one cycle of the reference clock signal and the unit time are generated.

In this state, the accuracy set for a fraction of an integer of the reference clock signal differs for each specification. In other words, the value of the integer differs for each specification. Accordingly, the delay amount control circuit 210 executes switching control of the control voltage Vc in a manner that the delay amount for one stage of the delay circuit 220 in one cycle of the reference clock signal CLK is the delay amount corresponding to the specification.

In more detail, the delay amount control circuit 210 includes a voltage controlled oscillator 211 formed by connecting an inverter 211b and plural stages of delay elements 211a, which have the same configuration as the delay elements 221, in a ring-like manner. The delay amount for each delay element 211a is controlled by a control voltage input applied to a control terminal thereof. The delay amount control circuit 210 forms a PLL circuit for locking an output signal (output frequency) of the voltage controlled oscillator 211 at a point where a delay amount for each delay element 211a of the voltage controlled oscillator 211 becomes a fraction of an integer of one cycle of a reference clock signal CLK. In this way, the control voltage applied to a control terminal of each delay element 221 is set in a manner such that the delay amount for each delay element 221 becomes a fraction of an integer of one cycle of the reference clock signal CLK.

To be more specific, in the delay amount control circuit 210, the frequency of an output signal of the voltage controlled oscillator 211 is divided by a predetermined frequency dividing ratio by a frequency divider 222, whereas the frequency of the reference clock signal output from the clock generation circuit 110 shown in FIG. 1 is divided by a predetermined frequency dividing ratio by a frequency divider 223. The phases of the signals resulting from the frequency division by the frequency dividers 222 and 223 are compared in a phase comparator 224. A signal according to a phase difference detected in the phase comparator 224 is output as a control voltage Vc from a low pass filter 225 (filter circuit). Each of the frequency dividing ratios may be "1".

The delay elements 211a included in the voltage controlled oscillator 211 and the delay elements 221 included in the delay circuit 220 will now be described in more detail.

Figure 3:
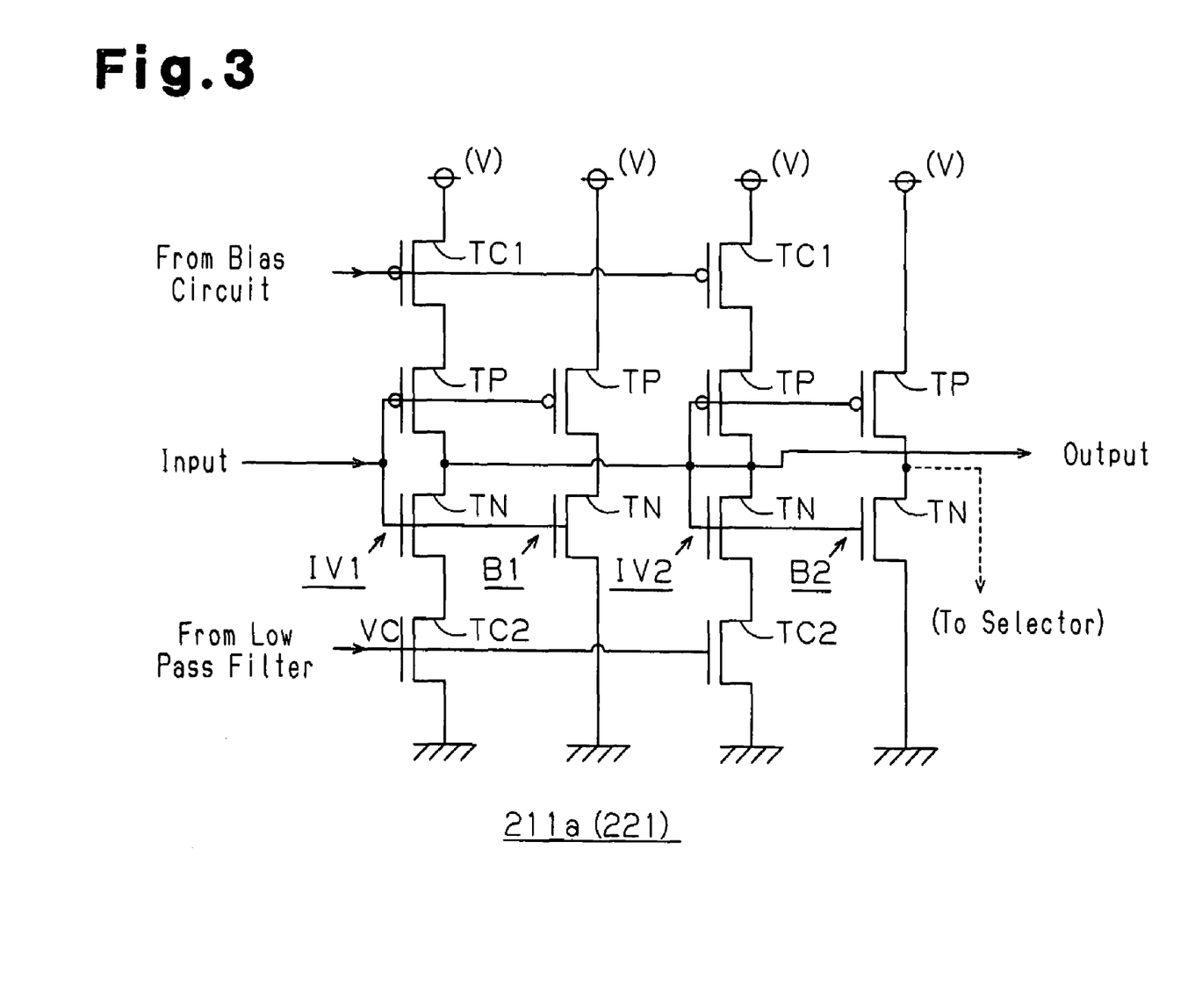
FIG. 3 is a circuit diagram showing the configuration of a delay element in the preferred embodiment.

A voltage of a predetermined value is applied by a bias circuit 240 to each of the delay elements 211a and the delay elements 221. The delay amounts for each of the delay elements 211a and the delay elements 221 are controlled according to the control voltage applied to the control terminal thereof. FIG. 3 shows the circuit configuration of each delay element 211a and each delay element 221.

As shown in FIG. 3, each delay element is basically formed by connecting, in series, two stages of inverters (inverters IV1 and IV2), each of which includes a P-channel transistor TP and an N-channel transistor TN. A current control transistor TC1 formed by a P-channel transistor is connected between the inverters IV1 and IV2 and a power supply potential V. A current control transistor TC2 formed by an N-channel transistor is connected between the inverters IV1 and IV2 and a ground potential. Buffer circuits B1 and B2 are provided in correspondence to the inverters IV1 and IV2. Each of the buffer circuits B1 and B2 is formed by a P-channel transistor TP and an N-channel transistor TN whose gate electrodes are electrically connected to the gate electrodes of the transistors TP and TN of the corresponding one of the inverters IV1 and IV2.

Voltage of a predetermined value is applied to the gate terminal of the current control transistor TC1 of each of the inverters IV1 and IV2 by the bias circuit 240 shown in FIG. 2. Also, control voltage Vc is applied to the gate terminal of the current control transistor TC2 of each of the inverters IV1 and IV2.

Thus, when the control voltage Vc increases, the current flowing through the inverters IV1 and IV2 increases, and the delay amount added to the signal input into the delay element decreases. When the control voltage Vc decreases, the current flowing through the inverters IV1 and IV2 decreases, and the delay amount added to the signal input to the delay element increases. In this way, the delay amount of the delay element is controlled by the level of the control voltage Vc.

An output of the inverter IV2, which is the latter stage in the delay element, is input to the delay element of the next stage. The selector 230 shown in FIG. 2, however, retrieves the output of the buffer circuit B2 of the latter stage provided in correspondence to the inverter IV2 of the latter stage.

The process for generating a delay signal executed by the delay signal generation circuit 200, which has the delay elements described above will now be described.

To set the delay amount for the delay element 221 as a fraction of a predetermined integer of one cycle of a reference clock signal, the control unit 30 shown in FIG. 1 outputs a frequency dividing ratio setting signal according to whether the optical disc 1 is a CD or a DVD to each of the frequency dividers 222 and 223 included in the second circuit 152.

In the preferred embodiment, a delay amount for one stage of the delay circuit 220 is set to have an accuracy of one thirty-second of one cycle of the reference clock signal in the case of a CD, and is set to have an accuracy of one fortieth of one cycle of the reference clock signal in the case of a DVD. Accordingly, the delay circuit 220 includes the delay elements 221 of 40 stages connected in series. The voltage controlled oscillator 211 includes the delay elements 211a of 20 stages connected in series. Thus, a time period corresponding to one cycle of a signal oscillated by the voltage controlled oscillator 211 substantially coincides with delay amounts (delay times) applied to the delay elements 221 of 40 stages included in the delay circuit 220.

Accordingly, the frequency dividing ratio used in the frequency divider 222 and the frequency dividing ratio used in the frequency divider 223 are both set at "1" when the optical disc 1 is a DVD. In this case, the output of the voltage controlled oscillator 211 is locked at a point where the cycle of the output signal of the voltage controlled oscillator 211 and the cycle of the reference clock signal coincide with each other. This locks the control voltage Vc. One fortieth of the cycle of the output signal of the voltage controlled oscillator 211 is the delay amount of each delay element 211a. Accordingly, the delay amount of each delay element 211a is one fortieth of one cycle of the reference clock signal.

When the optical disc 1 is a CD, the frequency dividing ratio used in the frequency divider 222 is set at "4", and the frequency dividing ratio used in the frequency divider 223 is set at "5". In this case, the output of the voltage controlled oscillator 211 is locked at a point where the cycle of the output signal of the voltage controlled oscillator 211 becomes five fourths of the cycle of the reference clock signal. This locks the control voltage Vc. One fortieth of the cycle of the output signal of the voltage controlled oscillator 211 corresponds to a delay amount applied to each delay element 211a. Accordingly, the delay amount of each delay element 211a corresponds to one thirty-second of one cycle of the reference clock signal.

When the optical disc 1 is a CD, the selection range of the output of the delay elements 221 of the delay circuit 220 is restricted in the selector 230. To be more specific, among the delay elements of the 40 stages, the outputs of the delay elements of the 1st to 32nd stages become effective for the selection, and the delay elements of the 33rd and the subsequent stages become ineffective for the selection.

In this way, by appropriately switching the frequency dividing ratio of the output signal of the voltage controlled oscillator 211 and of the reference clock signal with the frequency dividers 222 and 223, a delay amount for each delay element 221 is controlled to be switched to a value suitable for each disc medium.

In the logic circuit 300 shown in FIG. 2, a recording pulse is generated based on the delay signals D1 to D4 output from the delay signal generation circuit 200 and the clock synchronization signal.

Figure 4:
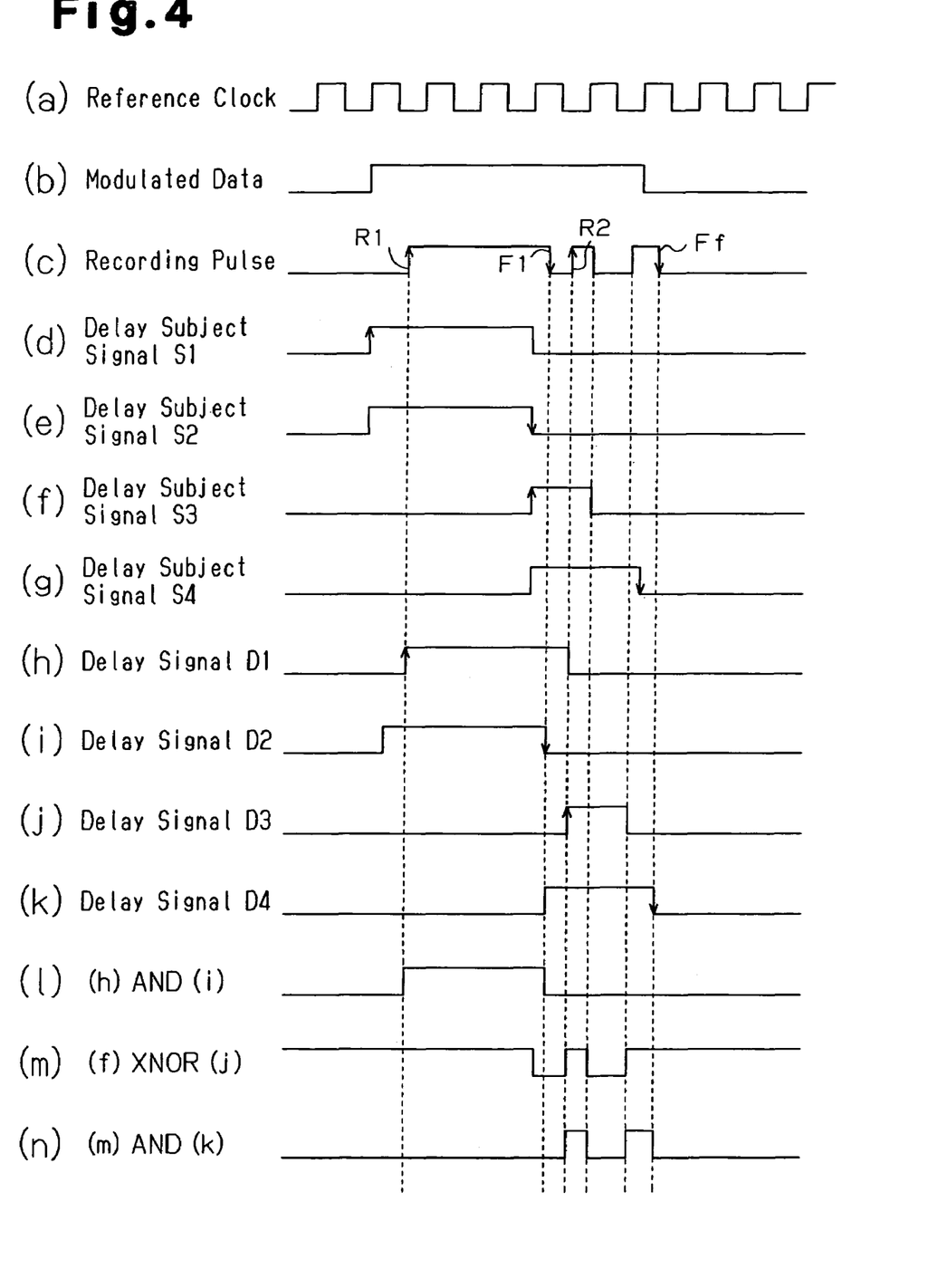
FIG. 4 is a timing chart showing a generation mode of a recording pulse in the preferred embodiment.

The process for generating the recording pulse in the preferred embodiment will now be described with reference to FIG. 4.

FIG. 4(b) shows one example of data modulated by the DVD encoder 120 or by the CD encoder 130. The modulated data is synchronized with edges of the reference clock signal shown in FIG. 4(a). The modulated data is subjected to pulse modulation based on the table data stored in the register 151a shown in FIG. 1. This generates the recording pulse shown in FIG. 4(c).

The recording pulse is set to correspond to each pulse of the modulated data (from the rising edge to the fall edge of the data). The recording pulse corresponding to each pulse of the modulated data has one or more pulses. Although FIG. 4(c) shows an example of a recording pulse that has three pulses, the number of pulses configuring the recording pulse varies depending on the pulse length of the modulated data.

As shown in FIG. 4(c), the rising edge and the falling edge of each pulse that configuring the recording pulse is not necessarily synchronized with the rising edge of the reference clock signal. This is because the rising edge R1 of the first pulse of the recording pulse, the falling edge F1 of the first pulse, the rising edge R2 of the second pulse, and the falling edge Ff of the final pulse serve as parameters adjusted to appropriately record data onto the optical disc 1.

When generating the recording pulse, the rising edge R1 of the first pulse, the falling edge F1 of the first pulse, the rising edge R2 of the second pulse, and the falling edge Ff of the final pulse are set using the four delay signals D1 to D4.

To enable these settings, delay subject signals S1 to S4 are first generated in the first circuit 151 shown in FIG. 1 according to each pulse of the modulated data, that is, according to the desired recording pulse (FIGS. 4(d) to 4(g)). The delay subject signal S1 shown in FIG. 4(d) has a pulse that rises to precede the rising edge R1 of the first pulse by not more than one cycle of the reference clock signal. This is because a maximum delay amount applied by the delay circuit 220 corresponds to one cycle of the clock signal. In the same manner, the delay subject signal S2 shown in FIG. 4(e) has a pulse that falls to precede the falling edge F1 of the first pulse by not more than one cycle of the reference clock signal. As show in FIGS. 4(d) and 4(e), the delay subject signal S1 and the delay subject signal S2 are assumed to be the same signal. The delay subject signal S3 shown in FIG. 4(f) has a pulse that rises to precede the rising edge R2 of the second pulse by not more than one cycle of the reference clock signal. Further, the delay subject signal S4 shown in FIG. 4(g) has a pulse that falls to precede the falling edge Ff of the final pulse by not more than one cycle of the reference clock signal.

The delay subject signals S1 to S4 and delay amount setting signals corresponding to the delay subject signals S1 to S4 are first generated in the first circuit 151 shown in FIG. 1. Based on these signals, delay signals D1 to D4 (FIGS. 4(h) to 4(k)) are then generated in the delay signal generation circuit 200 shown in FIG. 2. The delay signal D1 shown in FIG. 4(h) rises in synchronization with the rising edge R1 of the first pulse. The delay signal D2 shown in FIG. 4(i) falls in synchronization with the falling edge F1 of the first pulse. The delay signal D3 shown in FIG. 4(j) rises in synchronization with the rising edge R2 of the second pulse. Further, the delay signal D4 shown in FIG. 4(k) falls in synchronization with the falling edge Ff of the final pulse.

In the second circuit 152 shown in FIG. 1, the recording pulse is generated using the delay signals D1 to D4. To be more specific, as shown in FIG. 4 (l), an AND signal of the delay signal D1 and the delay signal D2 is generated. As shown in FIG. 4(m), an exclusive OR signal of the delay subject signal S3 and the delay signal D3 is generated. Further, as shown in FIG. 4(n), an AND signal of the signal shown in FIG. 4(m) and the delay signal D4 is generated. Using an OR signal of the signal shown in FIG. 4(l) and the signal shown in FIG. 4(n), the recording pulse shown in FIG. 4(c) is generated.

The process for generating the recording pulses shown in FIGS. 4(l) to 4(n) schematically represents the recording pulse generation process executed in the second circuit 152. In the actual process, the recording pulse is generated using, in addition to the delay subject signals, a clock synchronization signal and the like output from the first circuit 151.

The preferred embodiment described above has the following advantages.

(1) The delay amount control circuit 210 controls the control voltage VC applied to each delay element 221 of the delay circuits 220 in a manner that a delay amount for each delay element 221 becomes a predetermined faction of an integer of one cycle of the reference clock signal CLK. Also, the delay amount control circuit 210 switches the predetermined integer according to the specification relating to generation of the recording pulse. This enables the same delay circuit 220 to be used when the disc medium onto which data is to be recorded is a CD and when the disc medium is a DVD. Thus, enlargement of the circuit scale of the delay signal generation circuit 200 (write strategy circuit 150) is suppressed in an optimal manner.

(2) The delay amount control circuit 210 is formed as a PLL circuit that locks the output signal of the voltage controlled oscillator 211 at a point where the delay amount for each delay element 211a becomes a predetermined fraction of one cycle of the reference clock signal CLK. The voltage controlled oscillator 211 is formed by connecting the plural stages of delay elements 211a, which having the same configuration as the delay elements 221, in a ring-like manner. This simplifies the configuration of the delay amount control circuit 210 that generates the control voltage Vc.

(3) The first circuit 151 of the write strategy circuit 150 includes the register 151a for storing the table data defining the pulse modulation mode of data subject to pulse-modulation according to specifications that differ from each other. Therefore, by externally designating the table data, the recording pulse is generated both when data is to be recorded onto a DVD and when data is to be recorded onto a CD. Due to the employment of the register, an increase in the circuit scale of the write strategy circuit is suppressed compared with when all the table data is stored within the write strategy circuit. Also, by changing the table data stored in the register, a recording pulse that is in accordance with the specification of a disc medium other than a DVD and a CD may also be generated. In this way, the write strategy circuit has versatility.

The above preferred embodiment may be modified as described below.

The clock generation circuit 110 for generating a reference clock signal is not limited to the above configuration. For example, the circuit that generates a clock signal for CDs may generate the reference clock signal based on the wobble signal read from an optical disc in lieu of the oscillator.

The rotation of an optical disc when recording data does not have to be controlled using the constant linear velocity method and may be controlled using the constant angular velocity method. In this case, a reference clock signal is generated based on a signal retrieved as a laser reflection from a rotation-controlled optical disc controlled in the same manner as in the PLL circuit 112.

The quantity of the stages of delay elements in the voltage controlled oscillator 211 may be one.

The delay elements 211a and the delay elements 221 are not limited to the configuration exemplified in FIG. 3. Further, the delay elements 211a and the delay elements 221 are not limited to circuits that delay an input signal and output a delayed signal, but may be an inverter that delays an input signal and outputs a logically inverted signal. In this case, an inverter may be provided at the output of the selector 230, and the voltage controlled oscillator may include an odd number of inverters.

The delay amount control circuit 210 is not limited to the configuration exemplified in FIG. 2.

The write strategy circuit is not limited to a configuration functioning only to generate a recording pulse as a timing signal. For example, the write strategy circuit may function to generate a sampling signal, which is generated by adding a predetermined delay to the rising or falling edge of a reference clock signal and used to control a recording laser output, as a timing signal. This is also effective when applying a delay signal generator according to the present invention for generating a delay signal through processing executed by a delay signal generation circuit.

The optical disc is not limited to those exemplified in the above preferred embodiment and may be any disc medium. In such a case, the use of a delay signal generated by the delay signal generation circuit is effective when the laser irradiation mode is controlled based on two or more specifications.

The invention claimed is:

1. A delay signal generator generating a plurality of delay signals including a first delay signal used in recording data to a first-type disc media and a second delay signal used in recording data to a second-type disc media, the delay signal generator comprising:
   a delay circuit for delaying an input signal in a stepped manner and including a plurality of series-connected first delay elements, each controlling a delay amount in accordance with a control voltage;
   a delay amount control circuit, connected to the delay circuit, for generating the control voltage and supplying the plurality of first delay elements with the control voltage; and
   a selector, connected to the delay circuit, for selecting an output of one of the plurality of first delay elements and generating a delay signal with a predetermined delay amount;
   wherein the delay amount control circuit includes:
   a voltage controlled oscillator having a plurality of second delay elements connected in a ring-like manner, the second delay elements each having the same configuration as the first delay elements, and the quantity of the second delay elements being based on the quantity of the first delay elements;
   a first frequency divider, connected to the voltage controlled oscillator, for receiving a frequency dividing ratio setting signal generated depending on the type of the disc media and for dividing the frequency of an output signal of the voltage controlled oscillator by a first frequency dividing ratio according to the frequency dividing ratio setting signal to generate a first frequency-divided signal;
   a second frequency divider for receiving the frequency dividing ratio setting signal and a predetermined reference clock signal generated depending on the type of the disc media and for dividing the frequency of the predetermined reference clock signal by a second frequency dividing ratio according to the frequency dividing ratio setting signal to generate a second frequency-divided signal;
   a phase comparator, connected to the first and second frequency dividers, for comparing a phase of the first frequency-divided signal and a phase of the second frequency-divided signal to generate a comparison signal; and
   a filter circuit, connected to the phase comparator, for generating the control voltage in response to the comparison signal;
   wherein the delay amount control circuit changes the delay amount for one of the first delay elements included in the delay circuit by changing a frequency dividing ratio rate that is a ratio of the second frequency dividing ratio relative to the first frequency dividing ratio.

2. The delay signal generator according to claim 1, wherein:
   the delay amount control circuit generates a first control signal for generating a first delay signal when dividing the frequency of the reference clock signal by m, where m is a natural number, and generates a second control signal for generating a second delay signal when dividing the frequency of the reference clock signal by n, where n is a natural number and n<m;
   the delay circuit includes an m number of first delay elements;
   the delay amount control circuit sets a delay amount for one of the first delay elements included in the delay circuit at 1/n of a cycle of the reference clock signal when the second delay signal is generated; and
   the selector selects an output of one of an n number of the first delay elements when the second delay signal is generated.

3. The delay signal generator according to claim 2, wherein:
   the voltage controlled oscillator includes an m/2 number of the second delay elements; and
   the delay amount control circuit sets the frequency dividing ratio at m/n when the second delay signal is generated.

4. The delay signal generator according to claim 1, wherein: the selector has a selection range of the output of the first delay elements, the selection range being variable depending on the type of the disc media.

5. A recording pulse generator for retrieving modulated data that has been subjected to a predetermined modulation process and generating recording pulses including a first recording pulse used in recording data to a first-type disc media and a second recording pulse used in recording data to a second-type disc media, the recording pulse generator comprising:
   a plurality of delay circuits, each of which delays an input signal in a stepped manner, includes a plurality of series-connected first delay elements, and controls a delay amount in accordance with a control voltage;
   a delay amount control circuit, connected to the plurality of delay circuits, for generating the control voltage and supplying the plurality of first delay elements included in each delay circuit with the control voltage;
   a plurality of selectors, each connected in correspondence with one of the plurality of delay circuits, each of the selectors selecting an output of one of the plurality of first delay elements included in the corresponding delay circuit and generating a delay signal with a predetermined delay amount; and
   a logic circuit, connected to the plurality of selectors, for logically synthesizing the delay signal of each selector to generate a recording pulse;
   wherein the delay amount control circuit includes:
   a voltage controlled oscillator including a plurality of second delay elements, each having the same configuration as the first delay elements and being connected in a ring-like manner, the quantity of the second delay elements being based on the quantity of the first delay elements;
   a first frequency divider, connected to the voltage controlled oscillator, for receiving the frequency dividing ratio setting signal generated depending on a type of the disc media and for dividing the frequency of an output signal of the voltage controlled oscillator by a first frequency dividing ratio according to the frequency dividing ratio setting signal and generating a first frequency-divided signal;
   a second frequency divider for receiving the frequency dividing ratio setting signal and a predetermined reference clock signal generated depending on the type of the disc media and for dividing the frequency of a predetermined reference clock signal by a second frequency dividing ratio according to the frequency dividing ratio setting signal and generating a second frequency-divided signal;

a phase comparator, connected to the first and second frequency dividers, for comparing a phase of the first frequency-divided signal and a phase of the second frequency-divided signal to generate a comparison signal; and a filter circuit, connected to the phase comparator, for generating the control voltage in response to the comparison signal;

wherein the delay amount control circuit changes the delay amount for one of the first delay elements included in each delay circuit by changing a frequency dividing ratio rate that is a ratio of the second frequency dividing ratio relative to the first frequency dividing ratio, wherein the delay amount control circuit receives a frequency dividing ratio setting signal generated depending on the type of the disc media and changes a delay amount for one of the first delay elements included in each delay circuit by changing the control voltage in accordance with the frequency dividing ratio setting signal.

6. The recording pulse generator according to claim 5, wherein:

when the frequency of the reference clock signal is divided by m, where m is a natural number, the logic circuit generates a first recording pulse signal having a pulse width controlled in accordance with that frequency dividing ratio, and when the frequency of the reference clock signal is divided by n, where n is a natural number and n<m, the logic circuit generates a second recording pulse signal with a pulse width controlled according to that frequency dividing ratio;

each of the plurality of delay circuits includes an m number of first delay elements;

the delay amount control circuit sets a delay amount for one of the first delay elements included in each delay circuit at 1/n of a cycle of the reference clock signal when the second recording pulse signal is generated; and each selector selects an output of one or an n number of the first delay elements when the second recording pulse signal is generated.

7. The recording pulse generator according to claim 6, wherein:

the voltage controlled oscillator includes an m/2 number of second delay elements; and the delay amount control circuit sets the frequency dividing ratio rate at m/n when the second recording pulse is generated.

* * * * *